(12) United States Patent
Dybdal et al.

(10) Patent No.: US 6,211,949 B1
(45) Date of Patent: Apr. 3, 2001

(54) METHOD OF ALIGNING IMAGES TO BE SCANNED AND A SCANNING APPARATUS FOR SUCH ALIGNMENT

(75) Inventors: Niels Dybdal, Valby; Søren Christian Ell, Copenhagen; Christen Hedegaard, Værløse; Hans Hemmingsen, Birkerød; Kim Skovgård Jensen, Copenhagen; Kjeld Moselund, Allerød, all of (DK)

(73) Assignee: Eskofot Digital Graphic Systems ApS, Glostrup (DE)

( * ) Notice: Subject to any disclaimer, the term of this patent is extended or adjusted under 35 U.S.C. 154(b) by 0 days.

(21) Appl. No.: 08/952,309

(22) PCT Filed: May 2, 1996

(86) PCT No.: PCT/DK96/00203

§ 371 Date: Feb. 19, 1998

§ 102(e) Date: Feb. 19, 1998

(87) PCT Pub. No.: WO96/35146

PCT Pub. Date: Nov. 7, 1996

(30) Foreign Application Priority Data

May 5, 1995 (DK) .................................................... 0524/95

(51) Int. Cl.[7] .......................... G03B 27/58; G03B 27/62; G03F 9/00
(52) U.S. Cl. ................................. 355/72; 355/75; 430/22
(58) Field of Search .................................. 355/22, 27, 33, 355/72, 208, 75, 85; 83/411; 430/22

(56) References Cited

U.S. PATENT DOCUMENTS

| | | | | |
|---|---|---|---|---|
| 5,390,001 | * | 2/1995 | Ishiwata et al. | 355/72 |
| 5,510,877 | * | 4/1996 | DeJong et al. | 355/208 |
| 5,849,441 | * | 12/1998 | Nara et al. | 430/22 |
| 5,926,289 | * | 7/1999 | Brandestini et al. | 355/75 |

* cited by examiner

Primary Examiner—Russell Adams
Assistant Examiner—Peter B. Kim
(74) Attorney, Agent, or Firm—Pillsbury Winthrop LLP

(57) ABSTRACT

A method of scanning a plurality of images that arranges a portion of an image medium, in a position with a reference mark roughly aligned. The portion of the image medium is scanned to determine the location of the reference mark. The entire image is then scanned immediately after scanning only the portion with the reference mark. A second image is positioned with a reference mark roughly aligned on a scanner. The portion of the second image that has the second reference mark is scanned to determine the location of the second reference mark. The second image medium is repositioned so that the reference mark is placed accurately in the same position of the scanner which was occupied by the first reference mark. The entire second image is then scanned immediately after repositioning the second image medium. The images, and corresponding reference marks, may be recorded in different image media, or in the same medium, such as a single sheet of film. A device according to the invention determines the position of the first and second reference marks, and repositions the second image medium such that the second reference mark coincides with the location which was occupied by a first reference mark.

24 Claims, 3 Drawing Sheets

METHOD OF ALIGNING IMAGES TO BE SCANNED AND A SCANNING APPARATUS FOR SUCH ALIGNMENT

BACKGROUND OF THE INVENTION

1. Field of the Invention

The present invention relates to a method of aligning at least two images to be scanned and a scanning apparatus for such alignment, where each image has at least one associated alignment area or mark positioned at a given position in relation to the image.

2. Description of Related Art

Alignment of this type is predominantly performed in order to superpose e.g. a number of colour separations, which are typically screened, of an original image or integrating these separations with text in the graphic industry.

In the art, separating the colours of a colour original into e.g. the well-known CMYK or YCMB (Yellow, Cyan, Magenta, Black) colour separations is performed using a computer and suitable software. This separation is performed in order to be able to reproduce the original in e.g. a printing process using the base colours of the colour separation.

In order to be able to precisely position these e.g. four individual and separate representations of the image, the separation also provides alignment or registering marks precisely positioned in relation to the actual image.

Depending on the apparatus producing the colour separations, these alignment or registering marks may be crosses in the film material representing the separations, or the marks may be holes, indentations or notches therein.

In the situation where holes, notches or indentations are provided, these are used in order to precisely position the separations in e.g. the printing machine.

EP 0 200 814 A1 discloses a method for registering colour separation film in order to provide the films with register holes for use in a separate reproduction process.

In the other situation where the marks are crosses or other types of marks or where selected image areas are used for alignment, this positioning in the printing machine may be more difficult.

The same problem may be seen when e.g. desiring to scan the separations to electronically superpose these, as the separations should be positioned very precisely on the scanner.

At present, this positioning of the images is performed by fixing the images on e.g. sheets of transparent film or job-sheets having registering holes for engagement with registering pins on the scanner, in positions where all separations are superposed when positioned on the scanner. Typically, the positioning error should be less than 5/100 mm, whereby this work is quite time consuming.

This positioning or aligning of the separations may be carried out based on the alignment marks, but is also possible to select corresponding image areas of each colour separation and use these selected areas as alignment or registering areas.

BRIEF SUMMARY OF THE INVENTION

An object of the present invention is to provide a solution to this problem of aligning images to be subsequently scanned.

Thus, a first aspect of the invention is to provide a method of aligning and scanning at least two images, each image being associated with at least one corresponding alignment area or mark positioned at a given position in relation to the image, which images when aligned and scanned are arranged on a substantially planar surface of a scanning apparatus for digitizing images. The method according to this aspect of the invention comprises identifying the approximate position of at least one corresponding alignment area or mark associated with each of the images, a first scanning process comprising scanning at least part of the at least one alignment area or mark of the first image directly followed by a complete scanning of the first image, a second scanning process comprising scanning at least part of the at least one alignment area or mark of the second image, determining a displacement(s) of each of the at least one alignment area(s) or mark(s) of the second image in relation to the at least one alignment area(s) or mark(s) of the first image, and cancelling out at least partly the determined displacement(s) of alignment area(s) or mark(s) of the second image directly followed by a complete scanning of said second image.

Here is should be understood that by an alignment area or mark according to the present invention is meant a graphical area or element having a two dimensional structure, which can be unambiguously identified in order to be used for aligning.

In accordance with the present invention it is preferred that the alignment process is an integral part of the image scanning process or processes in which digitized forms of the images are obtained. Thus, it is preferred that the first scanning process comprises scanning the first image in order to obtain a digitized form of the first image, said scanning of the first image preferably being performed after or before scanning of the alignment area(s) or mark(s) of the first image. It is furthermore preferred that the at least partly cancelling out of the determined displacements is followed by a third scanning process comprising scanning the second image in order to obtain a digitized form of the second image.

In order to scan an image or an alignment area or mark, it is preferred that the image or alignment area or mark is moved along a substantially linear path during scanning. The scanning process may be performed by using a scanner head which also or as an alternative can be moved along a substantially linear path during scanning. Preferably, the movement of the image and/or the movement of scanning head defines a direction of scanning.

Typically, a scanning head may comprise one or more CCD-elements, and it is preferred that the direction of scanning is defined as being substantially perpendicular to a direction defined by the longitudinal extension of the CCD-element when arranged in the scanner head.

In one embodiment of the invention the scanning is performed by scanning the alignment area(s) or mark(s) and/or images in bands or stripes. In this embodiment it is preferred that the scanning head is moved in the direction of scanning, while the image may be moved in a direction parallel to the direction of scanning.

It should be understood that the identified area(s) or mark(s) of each image which are selected for alignment can be part of the image itself, but they may also be positioned outside an area covered by the image.

The rotation and/or movement of the image or planar surface is controlled by electronic means, for example by means of a computer or a microcontroller. Similarly, the adjustment performed by moving the scanner head is also controlled by such electronic means.

It should be understood that according to a method of the invention, identifying the alignment area(s) or mark(s) of the first image or determining of the position of the alignment area(s) or mark(s) of the first image may be done manually by a system operator by use of position digitizing means or based on scanned data representing a preview of the first image and associated alignment area(s) or mark(s).

However, when subsequently having scanned alignment area(s) or mark(s) of a second image, the displacement(s) of the alignment mark(s) of the second image may be determined automatically by calculations performed by use of electronic calculation means, for example a computer or a microcontroller, based on scanning data representing the alignment area(s) or mark(s) of the first image and the alignment area(s) or mark(s) of the second image. An example of such an automatic determination routine is given in Example 1.

It is also to be understood that the method described above also can be used when aligning any higher number of images, when each such image has to be aligned to a first image after identification of the alignment area(s) or mark(s) of the first image or after determination of the position of the alignment area(s) or mark(s) of the first image. Thus, it is preferred that three or four images are to be aligned and subsequently scanned, where each such image preferably represents a colour separation of a colour image.

According to one preferred embodiment of the method the film is transparent and is placed between the scanning head and a source of illumination.

In another preferred embodiment the film is non-transparent and both the scanning head and a source of illumination are placed on the same side of the film.

A second aspect of the invention provides for a scanning apparatus for aligning and scanning images, each image being associated with at least one corresponding alignment mark positioned at a given position in relation to the image, the images being present on at least one film, where the apparatus comprises a substantially planar surface on which the film(s) is/are mounted during scanning, a scanning head which is adapted to be moved along a substantially linear path and at a substantially constant distance from the surface during scanning of a film or image, means for moving the scanning head along the linear path, means for moving the substantially planar surface in a direction substantially perpendicular to the direction of movement of the scanner head, electronic calculation means for determining position(s) and displacements of positions of alignment mark(s), electronic storage means for storing the determined position(s) and displacement(s) of positions of alignment mark(s), first electronic control means for controlling the movement of the scanning head, and second electronic control means for controlling the movement of the substantially planar surface in the direction substantially perpendicular to the direction of movement of the scanner head. Preferably, this apparatus further comprises rotating means for rotating the substantially planar surface at an angle, and third electronic control means for controlling the angle of rotation of the substantially planar surface.

It is preferred that the third electronic control means is adapted to control the angle of rotation of the substantially planar surface, so that subsequently scanned images at least partly cancel out relative displacements of the images, said control being based on the determined position(s) and/or displacement(s) of positions of alignment mark(s). Preferably, the third electronic control means is adapted to control the rotating means so as to rotate the substantially planar surface before scanning of an image.

In order to determine the displacement(s) of alignment area(s) or mark(s), it is preferred that the electronic calculation means is adapted to perform an auto correlation of scanning data representing alignment areas or marks of images to be subsequently scanned.

In a preferred embodiment the scanning apparatus is a flat bed scanner. It is also preferred that the scanning head comprises at least one CCD-element.

Other aspects of the invention appear from the claims.

BRIEF DESCRIPTION OF THE SEVERAL VIEWS OF THE DRAWINGS

The invention can be more fully understood from the following detailed examples when taken in conjunction with the accompanying drawings, in which.

DETAILED DESCRIPTION OF THE INVENTION

EXAMPLE 1

In the following, the process and apparatus of the invention will be described by way of an example, where a number of colour separations of a colour image is to be superpositioned in order to generate the original image.

In the present example, the Individual separations or images are positioned individually, each on its own transparent film, which may be adhered to a job-sheet preferably having registering holes for precise positioning on the scanner. In other cases the film is non-transparent.

The separations themselves nave no registering holes—only alignment or registering areas or marks.

Figure 1:
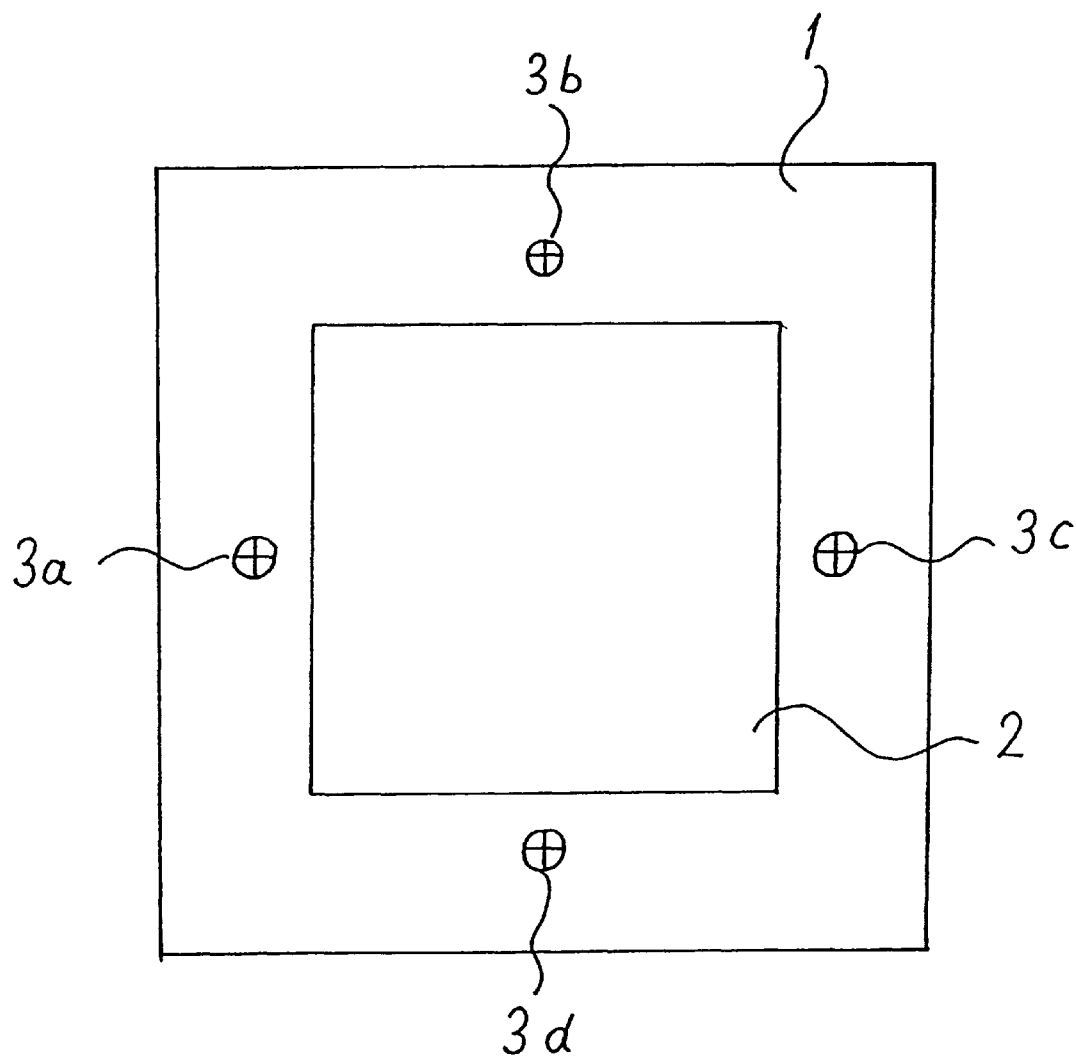
FIG. 1 shows a film having one image and its associated alignment marks.

In the present example the alignment areas or marks can be marks such as crossed lines provided during printing or plotting of the colour separations of the original image. This is illustrated in FIG. 1 which show an image 2 presented on a film 1. The film 1 also bears alignment marks 3a, 3b, 3c and 3d associated with the image 2. The alignment marks are positioned at given positions in relation to the image 2, which may represent one colour separation; for the other separations of the colour image the alignment marks should be placed in the same position in relation to the image 2. Any convenient number of alignment marks can be scanned according to the invention.

The manual method of superpositioning these separations is precisely positioning the films of images on the job-sheets so that the registering marks of the films when positioned on the scanner are positioned as close as possible to the same position. Typically, a positioning precision of 5/100 mm is required. Thus, this positioning operation is time consuming.

After positioning of images, these images are scanned and processed in order to superpose these and regenerate the original image in a page layout.

In the present example, each film carrying an image and associated alignment marks is adhered to a job-sheet having registering holes for positioning of the job-sheet on the scanner. Each image should preferably be adhered at the same position in relation to the registering holes of the job-sheet, thereby ensuring that the alignment marks of images to be subsequently scanned are within the alignment area to be scanned. This can be obtained by identifying the alignment marks of each corresponding image and having these substantially aligned when adhering the image carrying films to the job-sheets. However, the precision required in this operation is of the order of 1 mm and thus several orders of magnitude less than the precision required for fully manually aligning the images.

According to the present example, the separations are scanned one at a time and subsequently processed as described below.

Before scanning an image, areas comprising alignment marks of the first image to be scanned are identified, which identification is presently performed by, on the film carrying the first image to be scanned, positioning a digitizer at the position or close to the position of each of the marks to be used for the alignment so as to approximately define the positions of these alignment marks.

The areas corresponding to the alignment marks of the images to be subsequently scanned are identified or approximately defined through the identification of the alignment marks of the first image.

In the following, two alignment marks are used. First, the identified two alignment marks of the first image are scanned followed by a scan of the first image. Hereafter, the second film is placed on the scanner with its alignment marks approximately arranged positions corresponding to the positions of the alignment marks of the first image during scanning of this first image.

Now, the second film is at least partly scanned, the scanning comprising the area including the alignment marks, and from the scanned data the displacements of the second image in relation to the first image is determined as described in the procedure below.

After determination of the displacement of the second image this displacement is adjusted for as described below, and a full scan of the second image is performed.

The above mentioned steps of aligning and scanning of the second image are preferably followed when aligning and scanning subsequent images.

The separations may be scanned with a resolution of 350 lines/cm. In this situation, the presently used area scanned in order to identify the alignment mark will correspond to $5.12 \times 5.12$ mm$^2$, resulting in an image size of $128 \times 128$ pixels in 8 bits pixels. Naturally, other resolutions may be used depending on the resolution obtainable by the scanner used.

In this preferred embodiment, a given precision when defining the areas of the alignment marks is required in order to ensure that the alignment marks of the subsequent images are within the scanned area of approx. $5 \times 5$ mm$^2$. However, the precision required in this operation is several orders of magnitude smaller than the precision required for fully manually aligning the images.

Each of these smaller scanned images is Fourier transformed using 50% zero filling in order to avoid edge effects. The image is high pass filtered by using a box filter having a size of $10 \times 10$ values on the transformed image, now constituted by $156 \times 156$ values. During the filtering all values within a box of size $10 \times 10$ values around the zero frequency values are set to zero; the frequencies outside this box remain un-hanged.

Determining the displacement of an alignment mark of a subsequent image compared to the corresponding alignment mark of the first scanned image is performed by:

a) scanning on the subsequent film the area identified on the first film,
b) subjecting the scanned area of the first film to the above procedure,
c) subjecting the scanned area of the subsequent film to the above procedure, and
d) complex conjugating the Fourier transformed image corresponding to the second film and multiplying the two transformed images.

The multiplied Fourier spectrum is inversely Fourier transformed and the highest value in the resulting image is found by simply checking all values in the $256 \times 256$ cross correlated image.

The above procedure is similar to a cross correlation between high pass filtered versions of the two scanned small areas. From this cross correlated image, the following procedure will determine the displacement between the alignment marks.

If only a small precision of the determination of the displacement between the marks is required, the position of the pixel in the cross correlated image having the largest value will be used to determine this displacement.

However, if a better precision is desired, one can assume that the scanned image contains no abrupt shifts and that it, consequently, may be interpolated by e.g. a low-order polynomial in order to better identify the actual position of the peak. This assumption is typically valid for this type of data.

In the present preferred operation, the pixel values of the eight pixels closest to the highest-value-pixel are compared, and that of those pixels having the highest value is identified (the highest-value-neighbour).

Subsequently, it is assumed that the actual peak value is positioned in the area between four neighbouring pixels defining a square and comprising the highest-value-pixel and the highest-value-neighbour.

Therefore, the $4 \times 4$ pixels symmetrically positioned around the four-pixel square comprising the highest-value-pixel and the highest-value-neighbour are fitted by a 2D Lagrange polynomial of third order. This, in effect, corresponds to low pass filtering the image.

From this Lagrange polynomial, the position of the highest value may be determined with a precision of +/−a half pixel at 1000 lines/cm. This should be compared to the precision obtainable if no interpolation is used, i.e. corresponding to the resolution of the scanning which is typically 350 lines/cm.

The displacement of the mar of the subsequent image compared to that of the first scanned image may be found as the difference of positions from the position of the maximum value of the centre of the correlated image using the resolution of the scanned image.

From the determined displacements of the alignment marks of the two images, the subsequent image may be moved so as to cancel out or remove at least part of this displacement. Subsequent to this displacement, the subsequent image is scanned in a controlled manner taking into account a displacement, if any, in the direction of movement of the scanner head.

If only one alignment or registering mark is scanned corresponding to each image, a translation of the subsequent images may be performed. If more than one alignment mark is used, also a rotation of the subsequent images may be performed in order to more precisely adapt the positioning of the subsequent images to that of the first image.

Presently, the actual displacement of the image is provided on the flat bed of the scanner—preferably an ESKO-SCAN 2024 manufactured by ESKOFOT A/S, Denmark, —by actually translating and/or rotating the flat bed. As this displacement may be performed quite precisely, the resulting displacement of the images may easily obtain a final resolution where the alignment marks of all e.g. four separations of a colour image are positioned within 0.05 mm. This precision may only be obtained manually with great difficulty.

The ESKOSCAN 2024 scanner scans an image by scanning the image in bands or stripes of max. 1 cm and by moving the flat bed of the scanner so as to scan a new band. Thus, the flat bed is moved in a direction perpendicular to the direction of movement of the scanner head.

The additional rotation of the flat bed of the scanner compared to normal scanning is preferably performed using a step motor.

Thus, using the above-mentioned preferred scanner, the displacement of a subsequent image compared to that of the first image is removed by first rotating the flat bed in accordance with the determined angular difference—if any.

As the preferred rotation is preferably performed around a center positioned at a corner of the flat bed and, thus, not necessarily close to the image, the rotation will not only rotate the image, but also translate this slightly.

Consequently, this translation should be taken into account when determining the movement of the flat bed and when determining the displacement of the starting point of the subsequent image scanning.

At present, the step motor rotating the flat bed of the scanner is able to rotate the flat bed a total of ±0.4°, which gives a certain limit to the original positioning error of the image on the flat bed which can be compensated for. However, it will be possible to provide a scanner having a larger possible rotation of the flat bed, such as for example ±1° or ±10°.

The above procedure is not sensitive to the actual position of the identifying pointer in relation to the alignment mark. The final result of the operation performed on the data representing the scanned alignment marks of the two corresponding images, is the position in which the probability is the largest for the information of the two images to overlap, whereby it, naturally, will be best if the mark is totally inside the area, as this generates the results with the highest reliability. Even if a smaller part of the mark is in the area, the procedure will result in an approximately correct determined displacement.

In addition, the method is insensitive to the actual alignment mark used. Substantially all types of alignment marks may be used, as, as mentioned above, this statistical method merely provides information relating to the position where the information of the two images has the highest possibility of overlapping.

Figure 3:
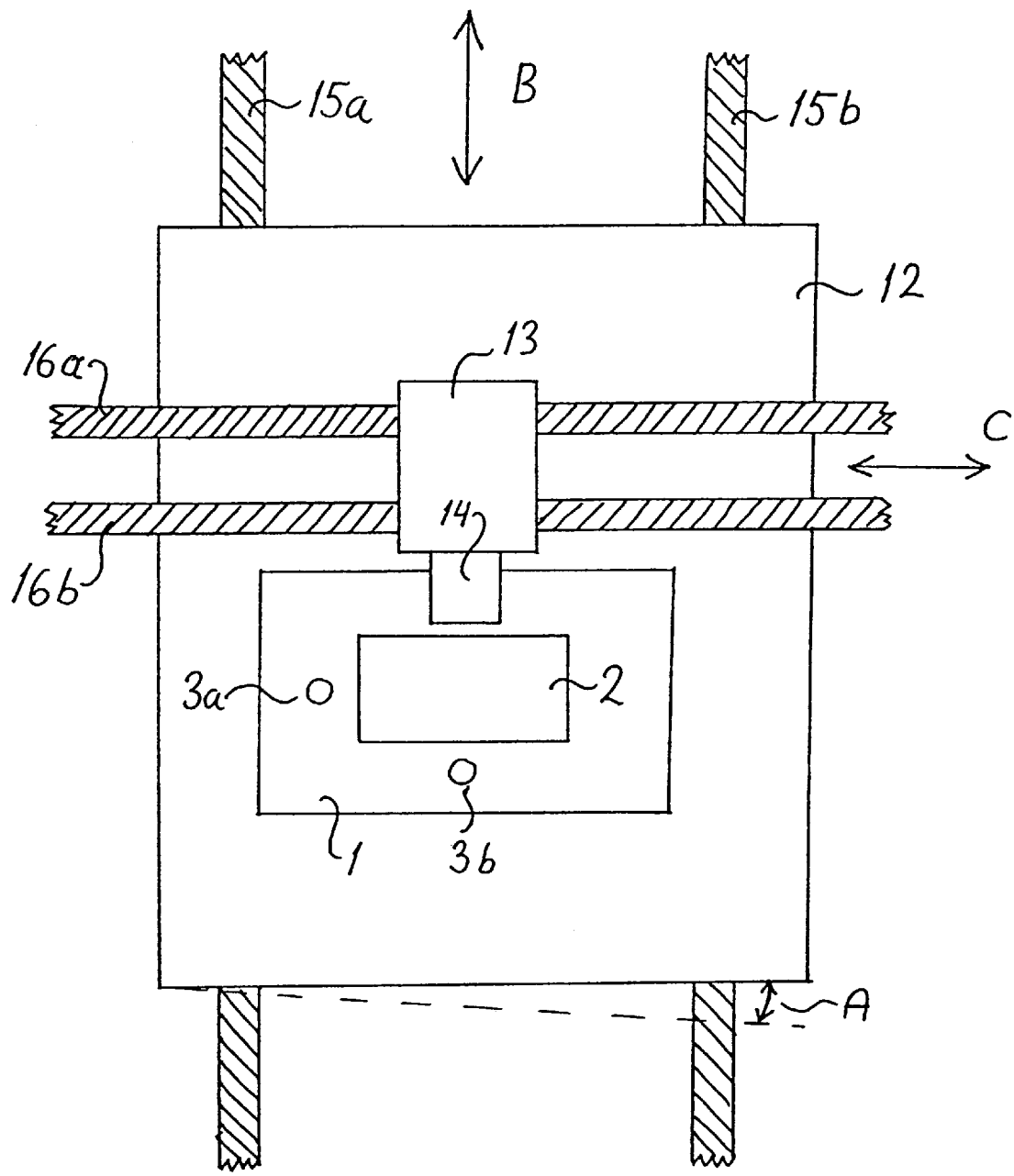
FIG. 3 shows a schematic drawing of a scanning apparatus according to a preferred embodiment of the invention.

FIG. 3 shows a schematic drawing of a scanning apparatus according to the invention. In FIG. 3 a film 1 having an image 2 with associated alignment marks 3a, 3b is to be aligned for subsequently image scanning of the image 2. The film 1 is mounted or adhered to a substantially planar surface 12, preferably by using vacuum. The film or image is scanned by a scanning head 13 comprising a camera 14, where the scanning head 13 during scanning is moved along a substantially linear path in the direction indicated by an arrow C following guiding rails 16a, 16b. The camera 14 of the scanning head 13 comprises a CCD-element, with the longitudinal extension of the CCD-element substantially perpendicular to the direction of movement of the scanner head 13.

The planar surface 12 can be rotated around an axis perpendicular to the planar surface 12 by an angle A in order to align the image to be scanned, and the planar surface 12 can be moved in a direction which is substantially perpendicular to the direction of movement of the scanning head 13 as indicated by an arrow B following guiding rails 15a, 15b.

In a preferred embodiment the image to be aligned is firstly rotated an angle be rotating the planar surface 12 in order to adjust for any errors of rotation between the position of the image to be scanned and the position of the first scanned image. Hence, any remaining errors in the direction of B are substantially cancelled by moving the planar surface 12 in the direction of B. For any remaining errors in the direction of C, the scanning head can be moved so as to substantially cancel out such errors. This is preferably done when scanning the image by selecting the starting point of the scanning of the image so as to take into account any such difference between the position of the first image and the position of the image to be scanned. However, the scanning head may also be moved to the determined starting point without being part of the actual scanning process.

In the Example 2 below, four images with associated alignment marks are presented on the same job-sheet.

EXAMPLE 2

Figure 2:
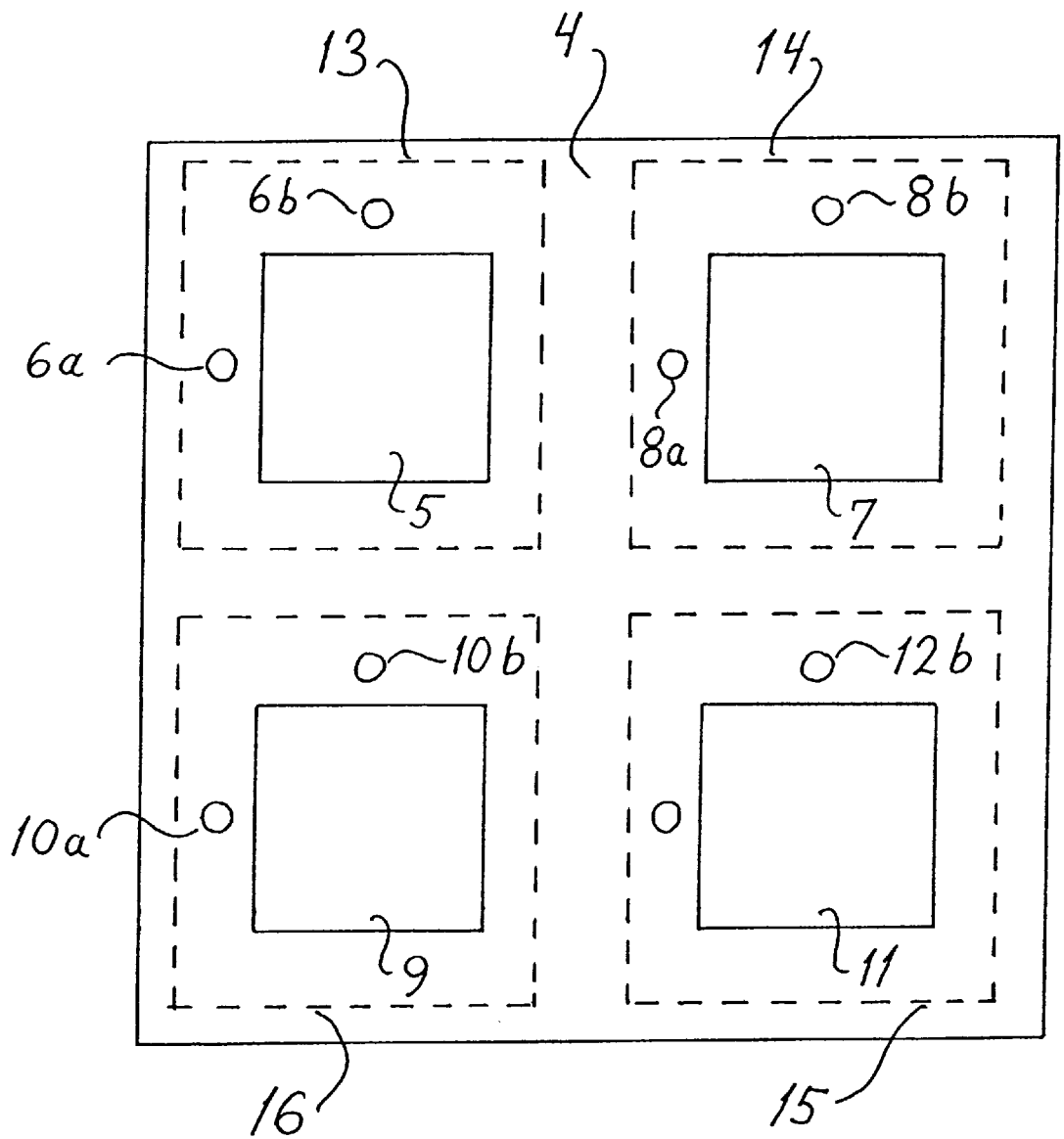
FIG. 2 shows a film having 4 images with associated alignment marks.

In the following is described an example referring to the situation where more than one image with associated alignment marks are positioned on the same job-sheet. This is illustrated on FIG. 2 which shows a job-sheet 4 having four films 13, 14, 15 and 16 with respective images 5, 7, 9 and 11 and associated alignment marks 6a, 6b, 8a, 8b, 10a, 10b and 12a, 12b. In the example of FIG. 2, each image has two associated alignment marks being positioned at given positions in relation to the image.

In this example, the four films are adhered to the job-sheet by a coarse manual alignment so that the four images are positioned approximately parallel to each other. Thus, if the positions of the two alignment marks 6a, 6b of image 5 are known, it is sufficient to know the position of alignment mark 8a in order to determine the position of alignment mark 8b of image 7.

Once the films have been adhered to the job-sheet, areas comprising a first corresponding alignment mark of each image are identified, which identification is performed by, on the film carrying the images to be scanned, positioning a digitizer at the position or close to the position of each of the first marks to be used for the alignment so as to approximately define the positions of these first alignment marks. For the first image to be scanned, the area to be scanned around the second alignment mark is also defined in this way.

Having identified the areas to be scanned of the first alignment marks of the four images and the area to be scanned of the second alignment marks of the first images, the areas to be scanned of the second alignment marks of the remaining three images to be subsequently scanned can be determined.

In the following scanning process, the areas of the two alignment marks of the first image are scanned, followed by a scanning of the first image. Then the areas of the two alignment marks of the second image are scanned, followed by a determination of displacements of the alignment marks of the second image, an adjustment of the position of the second image, followed by a scanning of the second image.

Having scanned the alignment marks of the second image, the procedure of Example 1 is repeated for each pair of marks in order to determine the displacements of the alignment marks of the second image, and hence, the displacement of the second image in relation to the first image.

The adjustment of the position of the second image may be performed by, based on the determined displacements, rotating the planar surface of the scanning apparatus on which the job-sheet is arranged and/or by moving the planar surface in a direction substantially perpendicular to a direction of movement of the scanner head. This adjustment is done to partly cancel out the determined displacements, while the remaining determined displacements are cancelled out by controlling or moving the position of the scanner head when scanning the second image.

The scanning procedure for the third and fourth images to be scanned follows the scanning procedure of image two. Naturally, this procedure may be performed for any number of images positioned on the same job-sheet.

What is claimed is:

1. A method of aligning and scanning at least two images, each image of said at least two images being formed in a portion of a respective image substrate and being associated with at least one corresponding alignment area or mark positioned in a respective one of said image substrates in relation to a respective one of said each at least two images, said at least two images when aligned and scanned are arranged on a substantially planar surface of a scanning apparatus for digitizing images, said method comprising:

identifying an approximate position of at least one corresponding alignment area or mark associated with each of said at least two images, scanning at least part of the at least one alignment area or mark of a first image of said at least two images, directly followed by a complete scanning of the first image, scanning at least part of the at least one alignment area or mark of a second image of said at least two images, determining a displacement of a position of each of the at least one alignment area or mark of the second image in relation to a position of the at least one alignment area or mark of the first image, and cancelling out at least partly the determined displacement, directly followed by a complete scanning of said second image.

2. A method of aligning and scanning at least two images according to claim 1, wherein the scanning apparatus comprises a scanning head and wherein one image of said at least two images is moved along a substantially linear path during scanning, said movement of said one image defining a direction of scanning.

3. A method of aligning and scanning at least two images according to claim 1 wherein the scanning is performed by scanning at least one said alignment area or mark and at least one of said at least two images in bands or stripes.

4. A method of aligning and scanning at least two images according to claim 1, wherein the identified alignment area or mark of each image of said at least two images is part of said each image itself.

5. A method of aligning and scanning at least two images according to claim 1, wherein the identified alignment area or mark of each of said first and second image is positioned outside an area covered by the respective first and second image.

6. A method of aligning and scanning at least two images according to claim 1, wherein each said first and second image has at least two associated alignment areas or marks positioned at given positions in relation to the respective first and second image, and wherein the at least partly cancelling out of the determined displacement comprises a rotation of the second image around an axis perpendicular to the planar surface, said rotation of the second image preferably being performed by rotating the substantially planar surface of the scanning apparatus.

7. A method of aligning and scanning at least two images according to claim 6, wherein an angle of rotation of the second image is in the range from −1° to +1°.

8. A method of aligning and scanning at least two images according to claim 1, wherein the determined displacement is stored electronically.

9. A method of aligning and scanning at least two images according to claim 1, wherein the identifying the approximate position of the at least one alignment area or mark of the first image is performed manually by a system operator by use of position digitizing means or based on scanned data representing a preview of the first image and associated area or mark.

10. A method of aligning and scanning at least two images according to claim 1, wherein at least three images are aligned and subsequently scanned, said images preferably representing colour separations of a colour image.

11. A method of aligning and scanning at least two images according to claim 2, wherein said image substrate is transparent film and is placed between the scanning head and a source of illumination.

12. A method of aligning and scanning at least two images according to claim 2, wherein said image substrate is non-transparent film and both the scanning head and a source of illumination are placed on the same side of the non-transparent film.

13. A method of aligning and scanning at least two images according to claim 1, wherein the scanning apparatus is a flat bed scanner and the scanning head comprises at least one CCD-element.

14. A method of aligning and scanning at least two images according to claim 1, wherein the scanning apparatus comprises a scanning head which is moved along a substantially linear path during scanning, said movement of the scanning head defining a direction of scanning.

15. A method of aligning and scanning at least two images according to claim 6, wherein an angle of rotation of the second image is in the range from −0.4° to +0.4°.

16. A method of aligning and scanning at least two images according to claim 1, wherein the image substrate is mounted on a surface and is maintained in a defined position relative to such surface during said step of scanning at least part of the at least one alignment area or mark and during the subsequent complete scanning of the first image.

17. A method of scanning a plurality of images, comprising:

positioning a portion of a first image medium in a partial scanning region of a scanning device, said portion of said first image medium having a first reference mark formed therein and said first image medium having a first image formed therein, said first reference mark being at a fixed location in said first image medium relative to said first image and defining a reference position;

scanning said portion of said first image medium and determining a location of said first reference mark in a resultant first partial image;

scanning the entire first image immediately after said scanning said portion of said first image medium;

positioning a portion of a second image medium in said partial scanning region of said scanning device, said portion of said second image medium having a second reference mark formed therein and said second image medium having a second image formed therein, said second reference mark being at a fixed location in said second image medium relative to said second image;

scanning said portion of said second image medium and determining a location of said second reference mark in a resultant second partial image;

repositioning said portion of said second image medium to arrange said second reference mark substantially in said reference position; and scanning the entire second image immediately after said repositioning of said portion of said second image medium.

18. A method of scanning a plurality of images according to claim 17, wherein said first and second reference marks are register marks.

19. A method of scanning a plurality of images according to claim 17, wherein said first reference mark is a selected portion of said first image and said second reference mark is a selected portion of said second image.

20. A method of scanning a plurality of images according to claim 17, wherein the first image medium and the second image medium are mounted on a surface of a scanning and are held in a fixed position relative to the surface during all of said scanning steps, said positioning step and said repositioning step.

21. A method of scanning a plurality of images, comprising:

positioning a first portion of an image medium in a partial scanning region of a scanning device, said first portion of said image medium having a first reference mark formed therein and said image medium having a first image formed therein, said first reference mark being at a fixed location in said image medium relative to said first image and defining a reference position;

scanning said first portion of said image medium and determining a location of said first reference mark in a resultant first partial image;

scanning the entire first image immediately after said scanning said first portion of said first image medium;

positioning a second portion of said image medium in said partial scanning region of said scanning device, said second portion of said image medium having a second reference mark formed therein and said image medium having a second image formed therein, said second reference mark being at a fixed location in said image medium relative to said second image;

scanning said second portion of said image medium and determining a location of said second reference mark in a resultant second partial image;

repositioning said second portion of said image medium to arrange said second reference mark substantially in said reference position; and scanning the entire second image immediately after said repositioning of said second portion of said image medium.

22. A method of scanning a plurality of images according to claim 21, wherein said first and second reference marks are register marks.

23. A method of scanning a plurality of images according to claim 21, wherein said first reference mark is a selected portion of said first image and said second reference mark is a selected portion of said second image.

24. A method of scanning a plurality of images according to claim 21, wherein said image medium is mounted on a surface of a scanning apparatus and is held in a fixed position relative to the surface during all of said scanning steps, said positioning step and said repositioning step.

* * * * *